United States Patent
Westwick et al.

(10) Patent No.: US 8,669,892 B2
(45) Date of Patent: Mar. 11, 2014

(54) DIGITAL-TO-ANALOG CONVERTER RESOLUTION ENHANCEMENT USING CIRCULAR BUFFER

(75) Inventors: Alan Westwick, Austin, TX (US); Sebastian Ahmed, Austin, TX (US)

(73) Assignee: Silicon Laboratories Inc., Austin, TX (US)

(*) Notice: Subject to any disclaimer, the term of this patent is extended or adjusted under 35 U.S.C. 154(b) by 26 days.

(21) Appl. No.: 13/427,740

(22) Filed: Mar. 22, 2012

(65) Prior Publication Data

US 2013/0249724 A1 Sep. 26, 2013

(51) Int. Cl.
H03M 1/66 (2006.01)

(52) U.S. Cl.
USPC ............................................ 341/144; 341/145

(58) Field of Classification Search
USPC ............ 341/144, 145, 120; 375/121; 370/516
See application file for complete search history.

(56) References Cited

U.S. PATENT DOCUMENTS

| 7,369,076 B1 | 5/2008 | Chung et al. |
| 7,679,540 B2 | 3/2010 | Ceballos et al. |
| 8,154,432 B2 | 4/2012 | Kaper et al. |
| 2011/0234200 A1* | 9/2011 | Shenoi ........................ 324/76.38 |

* cited by examiner

Primary Examiner — Joseph Lauture
(74) Attorney, Agent, or Firm — Meyertons, Hoods, Kivlin, Kowert & Goetzel, P.C.

(57) ABSTRACT

A system and method for generating an analog signal is disclosed. In one embodiment, system includes a first-in, first-out (FIFO) buffer configured to receive and store a plurality of digital values written to the FIFO buffer. The system further includes a digital-to-analog converter (DAC) coupled to read the digital values from the FIFO buffer and configured to convert the digital values to an analog signal. The FIFO buffer is configured to operate in a first mode in which writes to the FIFO buffer are inhibited and current digital values stored in the FIFO buffer are provided to the DAC in a repeating sequence.

20 Claims, 6 Drawing Sheets

US 8,669,892 B2

1

DIGITAL-TO-ANALOG CONVERTER RESOLUTION ENHANCEMENT USING CIRCULAR BUFFER

BACKGROUND

1. Technical Field

This invention relates to electronic circuits, and more particularly, to digital-to-analog converters.

2. Background Description

Digital-to-analog converters (DACs) are well known in the art of electronics. A DAC is a circuit configured to convert received digital numbers into analog currents or voltages. When a sequence of digital numbers is applied to a DAC, the DAC may output an analog signal. In one common application of a DAC, digital audio information may be provided to a DAC (or DACs) to generate audio signals suitable for audio playback. Many other DAC applications exist as well.

DACs come in a wide variety. Some commonly used DAC types include the binary weighted R-2R DAC, the thermometer-coded DAC, pulse width modulators, among others. Performance of a DAC may be defined by several different parameters. One parameter of a DAC is monotonicity, which refers to the ability of the DAC output to follow the same direction as a sequence of digital values input into the DAC. Another parameter of a DAC is its dynamic range, which measures the difference between the largest and smallest signals the DAC can produce. Resolution is another parameter of a DAC, which is the number of possible output levels that can be produced. Resolution is related to the number of bits the DAC may receive at its input. For example, if a DAC has six inputs, its resolution is $2^6$, or 64 possible output levels. Resolution is often times referred to in terms of the number of bits that may be input into the DAC. For example, the six-input DAC previously discussed may be referred to as having a resolution of six bits.

SUMMARY OF THE DISCLOSURE

A system and method for generating an analog signal is disclosed. In one embodiment, system includes a first-in, first-out (FIFO) buffer configured to receive and store a plurality of digital values written to the FIFO buffer. The system further includes a digital-to-analog converter (DAC) coupled to read the digital values from the FIFO buffer and configured to convert the digital values to an analog signal. The FIFO buffer is configured to operate in a first mode in which writes to the FIFO buffer are inhibited and current digital values stored in the FIFO buffer are provided to the DAC in a repeating sequence.

In one embodiment, a method includes operating a first-in, first-out (FIFO) buffer in a first mode in which writes to the FIFO buffer are inhibited and current digital values stored in the FIFO buffer are provided to the DAC in a repeating sequence. The method further includes generating an analog signal, wherein generating the analog signal comprises the DAC converting each of the current plurality of digital values into a portion of the periodic analog signal.

In another embodiment, a method includes operating a first-in first-out (FIFO) buffer in a first mode in which writes to the FIFO buffer are inhibited and current digital values stored in the FIFO buffer are provided to a digital-to-analog converter (DAC) in a repeating sequence. The method further includes converting the repeating sequence of digital values, using the DAC, into an analog signal, wherein each of the digital values includes M bits, and wherein the analog signal has a resolution of (M+x) bits.

BRIEF DESCRIPTION OF THE DRAWINGS

Other aspects of the disclosure will become apparent upon reading the following detailed description and upon reference to the accompanying drawings, which are now described as follows.

Figure 1:
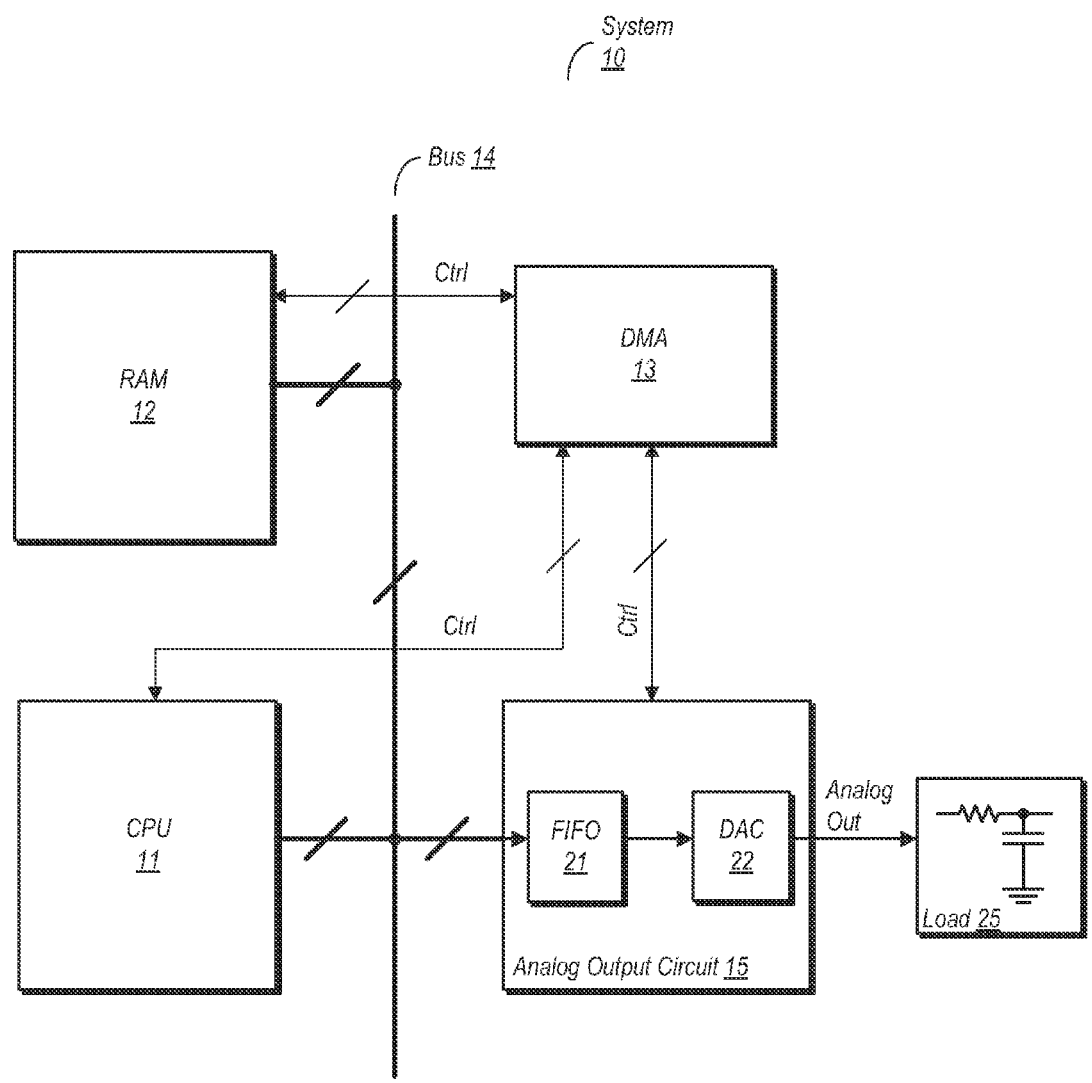
FIG. 1 is a block diagram of one embodiment of a system including an analog output circuit.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling within the spirit and scope of the present invention as defined by the appended claims.

DETAILED DESCRIPTION

Turning now to FIG. 1, a block diagram of one embodiment of a system including an analog output circuit is shown. In the embodiment shown, system 10 includes a central processing unit (CPU) 11, a random access memory (RAM) 12, a direct memory access (DMA) controller 13, an analog output circuit 15, and a load 25. CPU 11, RAM 12, and analog output circuit 15 are coupled to one another by a bus 14. In addition, CPU 11, RAM 12, and analog output circuit 15 are coupled to exchange various control signals (e.g., write enables, read enables, requests, etc.) with DMA control 13.

Bus 14 may be shared by CPU 11, RAM 12, and analog output circuit 15. That is, one of these agents may have access to bus 14 at a given time. In some embodiments, DMA controller may include arbitration circuitry for determining which agent is to receive access to bus 14 to access RAM 12 at a given time when multiple, conflicting requests are pending. In other embodiments, separate arbitration circuitry (not shown here) may be implemented for the purposes of determining which agent receives access to RAM 12 and bus 14.

In the embodiment shown, analog output circuit 15 includes a digital-to-analog converter (DAC) 22 configured to convert digital signals to an analog format. Analog signals may be output from DAC 22 to load 25, which may be any type of circuitry. In the embodiment shown, load 25 is depicted as a low pass filter. Although load 25 may be any type of circuitry, such circuitry may include some capacitance and some resistance, and thus some low pass filtering of various frequency components of the analog output signal may occur. In some embodiments, load 25 may be an audio speaker, a circuit using a current reference, a voltage reference, or another type of circuit using an output signal from a DAC such as DAC 22.

DAC 22 in the embodiment shown is coupled to receive digital values to convert to analog from first-in, first-out (FIFO) buffer 21 (hereinafter, 'FIFO 21'). In turn, FIFO 21 may receive digital values from RAM 12 via bus 14. In some embodiments, FIFO 21 may receive digital values from other agents coupled to bus 14, such as CPU 11. FIFO 21 may be utilized to buffer digital values provided to DAC 22 since other agents may sometimes have access to the bus and thus a steady stream of data to DAC 22 cannot always be guaranteed. Accordingly, the size of FIFO 21 may be any suitable sized buffer to ensure that DAC 22 may continue to receive digital data for conversion to analog.

In the embodiment shown, FIFO 21 may operate in one of two modes. In a first mode, FIFO 21 may operate as a normal FIFO. That is, data may be written into FIFO 21, read therefrom (and provided to DAC 22 in this embodiment) and be subsequently overwritten with new data. In another mode of operation in the embodiment shown, FIFO 21 may be operated as a circular buffer. More particularly, data may be read in a sequential manner from FIFO 21, but not overwritten. After all data has been read, the sequence may repeat itself while operation remains in the second mode. During operation in the second mode, additional writes are not made to FIFO 21. Furthermore, control circuitry coupled to FIFO 21 does not assert indications of an underrun or an empty buffer. Using FIFO 21 in the second mode, a periodic signal may be generated. Furthermore, operation in the second mode may also be used to extend the effective resolution of DAC 22. Additional details with regard to operation in the second mode are provided below.

Figure 2:
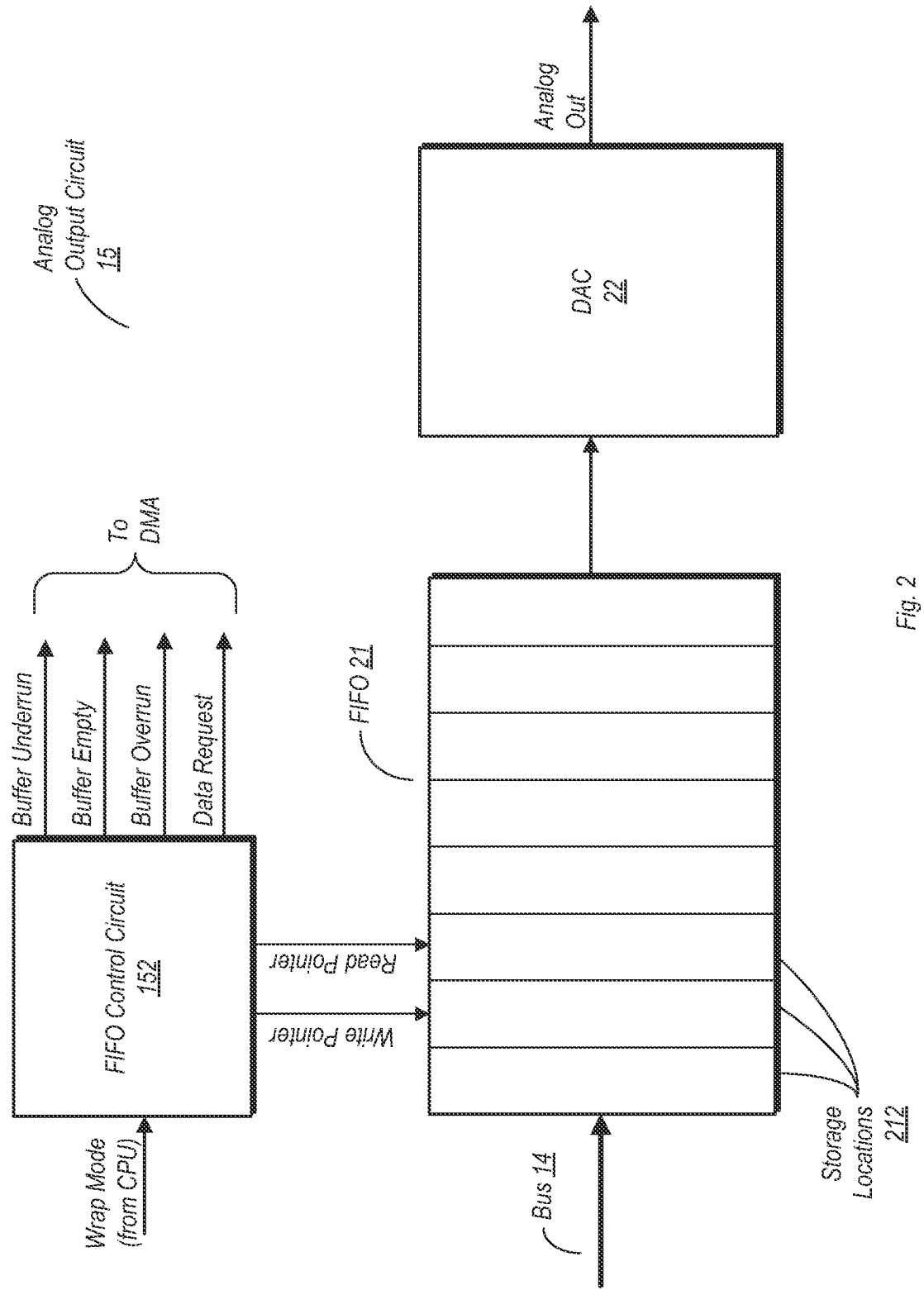
FIG. 2 is a block diagram of one embodiment of an analog output circuit.

Turning now to FIG. 2, a block diagram of one embodiment of an analog output circuit 15 is shown. In the embodiment shown, analog output circuit 15 includes FIFO 21, DAC 22, and FIFO control circuit 152. FIFO control circuit 152 may control the advancement of read and write pointers during read and write operations, respectively, on FIFO 21. The write pointer may point to a storage location 212 of FIFO 21 in which data is to be written during a write operation. The read pointer may point to a storage location 212 of FIFO 21 from which data is to be read during a read operation. In the illustrated embodiment of analog output circuit 15, data read from FIFO 21 is provided to DAC 22 for conversion into analog format. By periodically providing data from FIFO 21 to DAC 22 (e.g., at a sampling rate of DAC 22), a continuous analog signal may be generated.

In the embodiment shown, FIFO 21 includes eight storage locations 212. Each storage location 212 may store one block of data that may be subsequently provided to DAC 22 for conversion into a portion of an analog signal. The number of storage locations 212 may vary from one embodiment to the next, although the exact number of storage locations 212 may be any suitable number. In many embodiments, the number of storage locations may be an integral power of two. For example, in the embodiment illustrated in FIG. 2, the number of storage locations 212, eight, is $2^3$.

FIFO 21 in the embodiment shown may operate in one of two modes. A first of these modes is a normal mode, in which data is receiver from bus 14, written into a storage location 212 of FIFO 21, and subsequently read therefrom. Operation in the first mode may occur when the Wrap Mode signal is not asserted. After data had been read and provided to DAC 22, the corresponding storage location 212 may be overwritten. FIFO control circuit 152 may advance the read and write pointers during read and write operations, which may occur concurrently (albeit at different storage locations 212). When operating in the first mode, FIFO control circuit 152 may set a valid bit in each newly written storage location 212, and reset valid bits after a storage location has been read. The valid bit may indicate that the data in a given storage location 212 is ready for reading. When reset, the valid bit may indicate that the data in a given storage location has been read and is not to be read again.

FIFO control circuit 152 may assert various indications to DMA controller 13 during operation in the first mode. If the read pointer advances faster than the write pointer (as a result of reads occurring faster than writes), FIFO control circuit 152 may assert the buffer underrun signal. More particularly, if the number of valid storage locations 212 in FIFO 21 falls below a certain number, FIFO control circuit may assert the buffer underrun signal to indicate that data is not being received fast enough from RAM 12 to keep pace with data being read and provided to DAC 22. DMA controller 13 may respond to receiving the buffer underrun signal by transferring additional data from RAM 12 for FIFO 21.

If DMA controller 13 does not respond to assertion of the buffer underrun signal in a timely manner, it is possible that all storage locations 212 of FIFO 21 may be read and marked invalid. If each storage location 212 is to be read only once, then FIFO 21 may effectively be considered to be empty after each storage location 212 has been read if no additional data has been written thereto. In such a situation, FIFO control circuit 152 may assert the buffer empty signal. DMA controller 13 may respond to assertion of the buffer empty signal by causing more data to be transferred from RAM 12 to FIFO 21.

If DMA controller 13 attempts to transfer data to FIFO 21 faster than data can be read therefrom, FIFO control circuit 152 may assert the buffer overrun signal. This condition may be detected when FIFO control circuit 152 cannot advance the write pointer because the next storage location 212 has not yet been read or is in the process of being read. Responsive to assertion of the buffer overrun signal, DMA controller 13 may discontinue transferring data from RAM 12 to FIFO 21.

FIFO control circuit 152 may also assert the data request signal to request the transfer of additional data from RAM 12 to FIFO 21. The assertion of the data request signal may occur when additional data is desired but a buffer underrun condition has not otherwise occurred.

Operation in the wrap mode may occur when CPU 11 asserts the wrap mode signal (it is noted that other agents may assert a signal similar to the wrap mode signal in other embodiments). When operating in the wrap mode, FIFO 21 may effectively be operated as a circular buffer. Furthermore, when operating in the wrap mode, FIFO control circuit 152 may inhibit writes to FIFO 21, while not marking storage locations 212 as invalid once their contents have been read. Accordingly, the read pointer may advance from one location to the next in a sequential manner before returning to the beginning of FIFO 21 and repeating. Thus, digital values stored in FIFO 21 may be read and provided to DAC 22 in a repeating sequence. Operation in the wrap mode may be useful in situations when it is desired to produce a periodic analog signal or a steady state current or voltage output. Furthermore, as discussed below, operation in the wrap mode may enable the illustrated embodiment to output signals at a resolution that is higher than DAC 22 would otherwise be able to achieve.

In addition to inhibiting writes to FIFO 21 and inhibiting the invalidating of storage locations 212 as they are read, FIFO control circuit 152 may inhibit other signals. In the embodiment shown in FIG. 2, FIFO control circuit 212 may inhibit each of the buffer underrun, buffer empty, buffer overrun, and data request signals during operation in the wrap mode. This may effectively isolate FIFO 21 from bus 14 during wrap mode operations, freeing other agents for access to both the bus and RAM 12.

Figure 3:
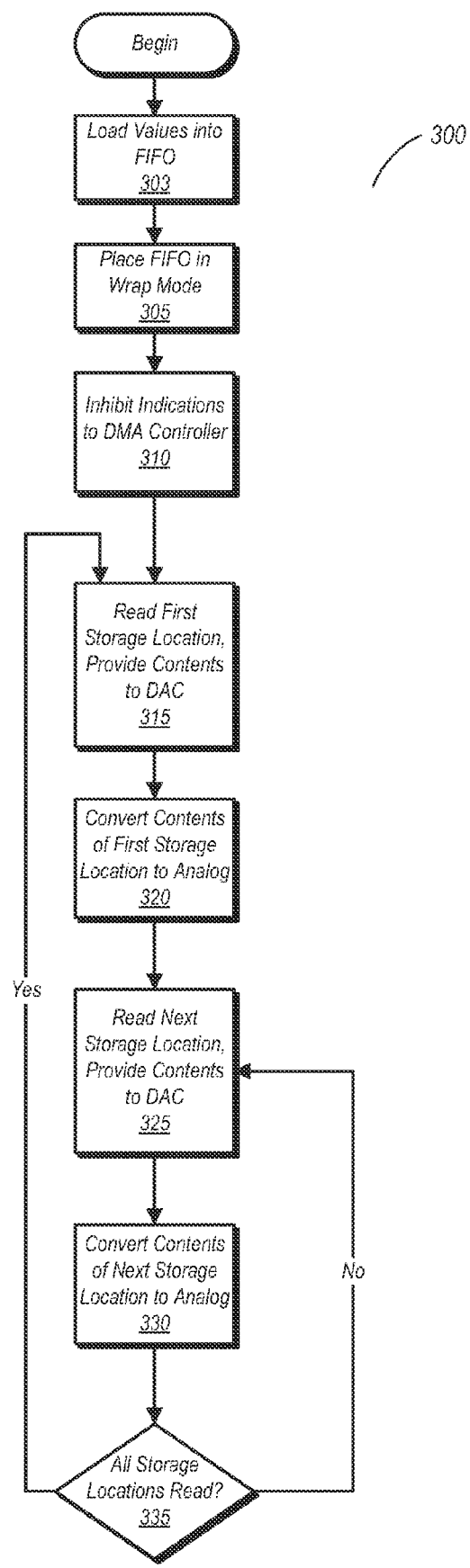
FIG. 3 is a flow diagram illustrating one embodiment of a method for generating an analog output signal from an analog output circuit.

FIG. 3 is a flow diagram illustrating one embodiment of a method for generating an analog output signal from an analog output circuit. Method 300 illustrated in FIG. 3 may apply to the apparatus embodiments discussed above in reference to FIGS. 1 and 2, or may apply to other apparatus embodiments not explicitly discussed herein.

In the embodiment shown, method 300 begins with the loading of digital values into a FIFO (block 303) and placing the FIFO in a wrap mode, as described above (block 305). In addition, a FIFO control circuit such as that discussed above may inhibit indications from being provided to a DMA controller (block 310). This may prevent the DMA controller from attempting writes to the FIFO during wrap mode operations, and may also increase the available bus and memory bandwidth available to other agents.

After entering wrap mode, operation may begin by reading a first storage location of the FIFO and providing its contents to a DAC (block 315). The DAC may convert the contents of the first FIFO storage location from a digital value to an analog voltage or current (block 320).

A next storage location may be read subsequent to the reading of the first (block 325), with its contents also provided to the DAC. The contents of the next storage location may converted by the DAC from a digital format to another analog voltage or current (block 330).

If each of the storage locations of the FIFO have not been read (block 335, the 'no' path), then the method may return to block 325 and read the next storage location in the sequence. The contents of the next storage location may be converted by the DAC from a digital format to an analog format. Block 325, 330, and 335 may repeat as read operations progress through each storage location of the FIFO. Once all storage locations of the FIFO have been read (block 335, the 'yes' path), method 300 may return to block 315 in which the first storage location of the FIFO is read. The method may then progress through the cycle previously discussed.

Figure 4:
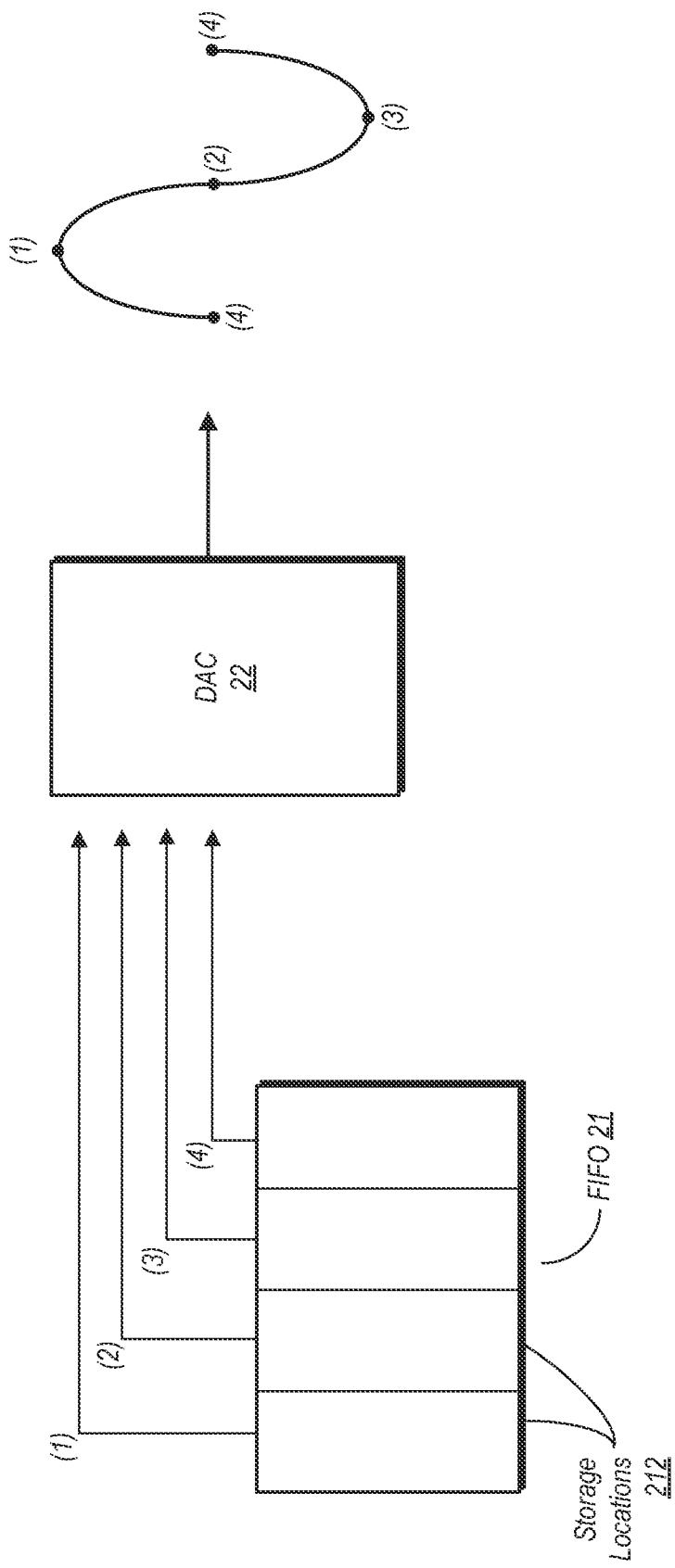
FIG. 4 is a graphic illustration of the production of a periodic analog output signal from an analog output circuit.

Due to its repeating nature, method 300 as described above may be useful for the generation of periodic analog signals based on a fixed number of digital values. This is further illustrated in FIG. 4. In the example of FIG. 4, FIFO 21 includes four storage locations 212, the contents of which may be read and provided sequentially to DAC 22. The digital values stored in the storage locations 212 are depicted here as (1), (2), (3), and (4), and are provided in that sequence to DAC 22. The analog output signal generated by DAC 22 is shown, which points corresponding to the digital values stored in FIFO 21 indicated on the depiction of the signal. It is noted that the depicted signal may in some embodiments be a current signal. In other embodiments, the depicted signal may be a voltage signal.

After each instance of DAC converting digital value (4) to analog form, the cycle may repeat itself, with the read pointer of FIFO 21 returning to the storage location 212 of digital value (1). By repeating this cycle while operating in the wrap mode, appropriate digital values may be used to generate a periodic signal.

Figure 5:
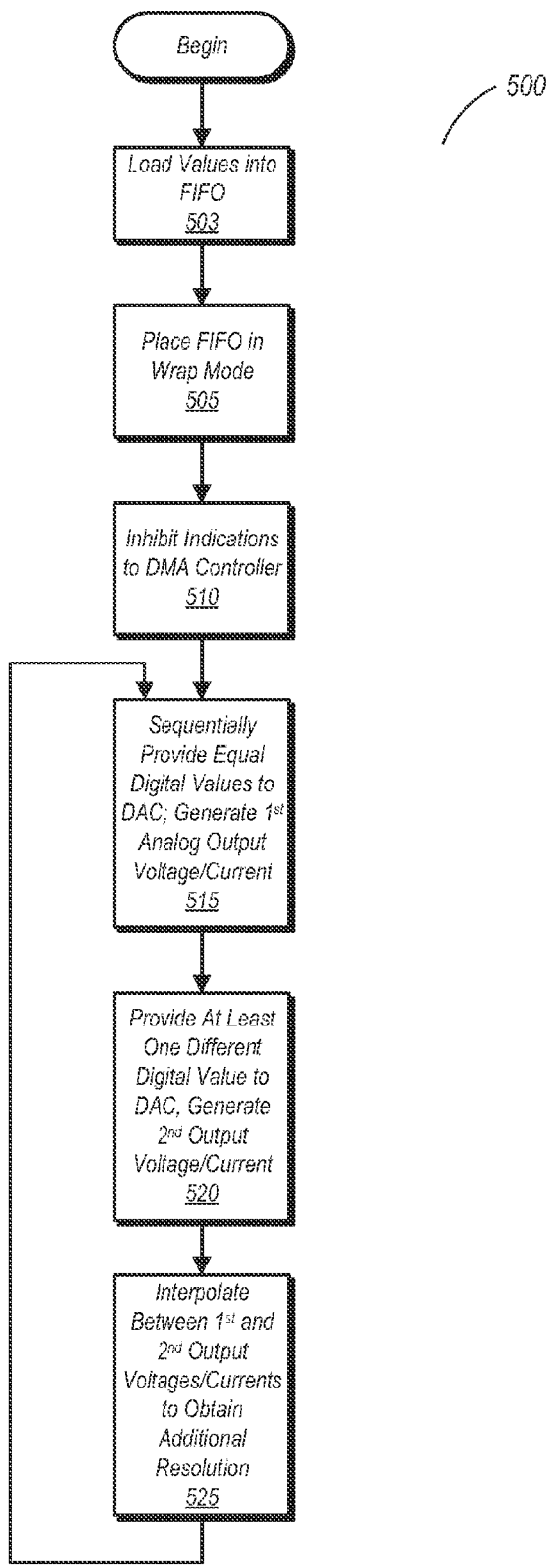
FIG. 5 is a flow diagram of one embodiment of a method for enhancing the output resolution of one embodiment of a DAC.

Turning now to FIG. 5, a flow diagram of one embodiment of a method for enhancing the output resolution of one embodiment of a DAC is shown. Method 500 may be performed using the various apparatus embodiments discussed above in reference to FIGS. 1 and 2. Additionally, method 500 may be performed on other apparatus embodiments not explicitly discussed herein.

Method 500 begins with the loading of digital values into the FIFO (block 503) and placing the FIFO in the wrap mode (block 505), and the inhibiting of any indications that might otherwise asserted and provided to the DMA controller when in the normal mode (block 510). Such indications include the buffer underrun, buffer empty, and data request indications discussed above. A FIFO controller may also prevent storage locations in the FIFO from being marked as invalid as their corresponding contents are read.

After entering the wrap mode, FIFO 21 may read and provide a number of equal digital values to the DAC, which may convert these values to a first analog output voltage or current (block 515). At least one instance of a different digital value may also be provided to the DAC and converted to a second voltage or current value (block 520). As noted above in the discussion of FIG. 1, one embodiment of an apparatus may include a load that in which inherent capacitance and resistance result in low-pass filtering of the signal output from the DAC. Accordingly, the output signal provided from the DAC and received by the load may be a version based on interpolation between the first and second output voltages or currents (block 525). The interpolated signal may have a higher resolution than the DAC might otherwise be able to produce. Method 500 may repeat while the FIFO remains in the wrap mode, cycling through a repeating sequence of blocks 515, 520, and 525.

Figure 6:
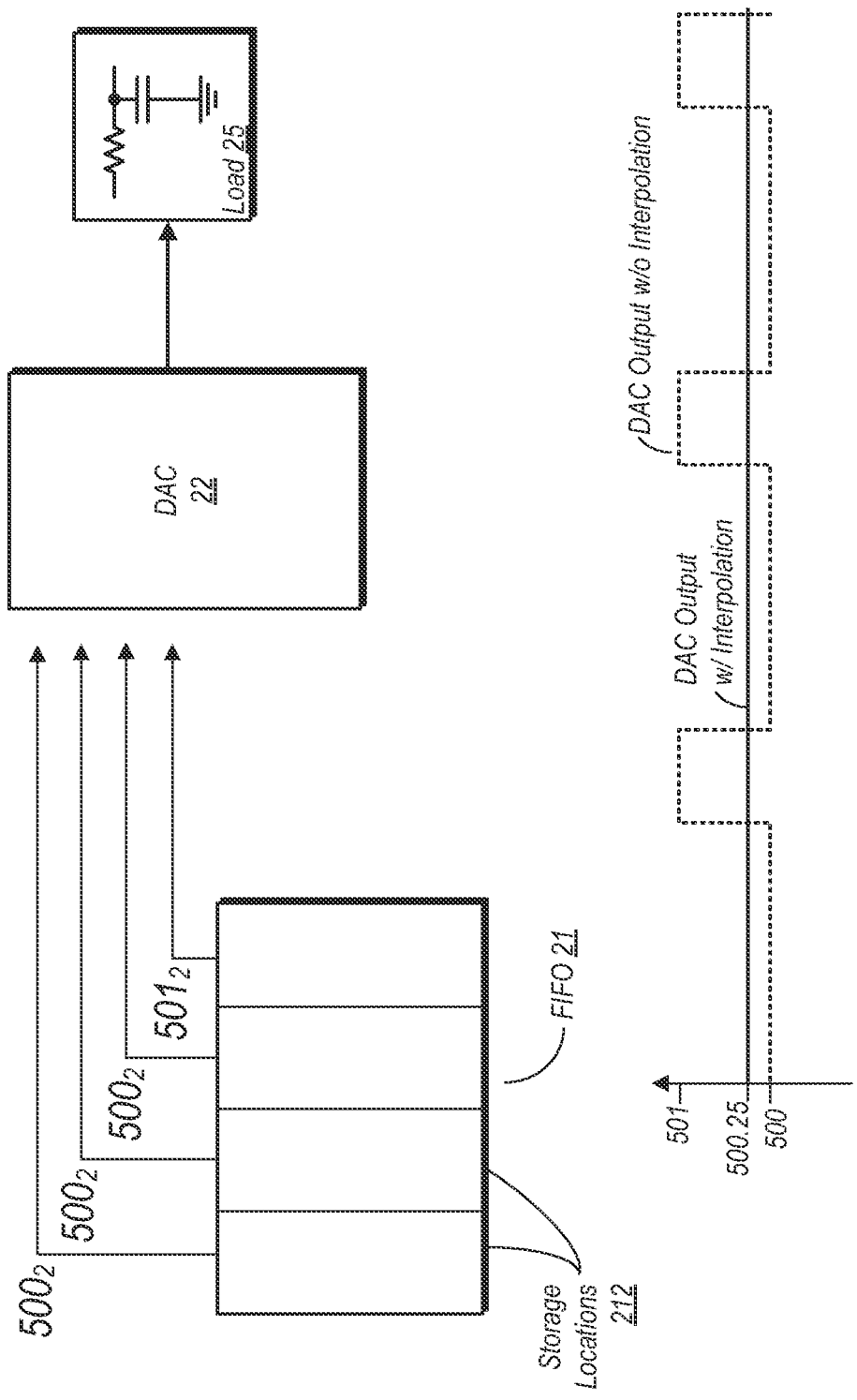
FIG. 6 is a graphic illustration of one embodiment of a method for enhancing the output resolution of one embodiment of a DAC.

FIG. 6 further illustrates the methodology by which a higher resolution may be achieved than what is otherwise available from the DAC. For the purposes of illustration, the example discussed herein will consider DAC 22 to be a 10-bit DAC. A 10-bit DAC as defined herein is a DAC configured to receive a 10-bit digital value and convert this value to an analog equivalent. Since there are 10 bits (M=10), there are $2^{10}$, or 1024 possible values that the output signal can take for any one digital value. If DAC 22 is a current DAC (i.e. outputs a current signal) having a resolution of one micro-ampere (1 µA) per bit, then the current range for the output signal of DAC 22 is 0-1023 µA.

In addition, FIFO 21 in the illustrated example includes four storage locations (N=4). In this example, it is desired to extend the resolution by two bits (x=2). For embodiments in which the number of storage locations in FIFO 21 is an integral power of two, the relationship between N and x can be expressed as $N=2^x$. Furthermore, the additional resolution obtainable can be found by dividing the resolution of DAC 22, in terms of value per bit, by N or $2^x$. In this case, since $N=2^x=4$, the additional resolution obtainable for the apparatus shown in FIG. 6 is 0.25 µA, which is equivalent to adding two bits of resolution to DAC 22.

In the example of FIG. 6, three storage locations 212 of FIFO 21 are storing digital values that are the binary equivalent of 500, while a fourth storage location is storing a digital value that is the binary equivalent of 501. If DAC 22 is a current DAC, then the output signal may thus be the average of three samples of 500 µA and one sample of 501 µA. The digital values are provided in a repeating sequence to DAC 22. In turn, DAC 22 converts these values to their analog equivalents and provides the output to load 25. As noted above, load 25 may include some inherent resistance and capacitance that effectively forms a low pass filter. Embodiments with an actual low pass filter coupled to the output of DAC 22 are also possible and contemplated. If the sampling rate is high enough (i.e., digital values are provided to and converted by DAC 22 at a fast enough rate), then the resultant output signal will be the interpolated output signal as shown in the graph at the bottom of FIG. 6. As noted above, this value may be 500.25 µA. Since DAC 22 normally has a resolution of only 1 μA, the ability to produce a signal having a resolution of 0.25 μA thus results in an enhancement of its output resolution.

Various apparatus embodiments similar to those discussed above may be operated to provide enhanced resolution of a DAC. Generally, the values of various current and voltages will depend on a particular implementation, with the above examples being merely illustrative. In general, for an M-bit DAC coupled to receive digital values from a FIFO having N storage locations, the output resolution may be enhanced to (M+x) bits. The equation $N=2^x$ may describe the relation between the number of storage locations and the number of additional bits of resolution that may be obtained. It is noted that the methodology described above may also be possible in embodiments in which the number of storage locations is not an integral power of two. The methodology may be performed instead by using a number of storage locations that are an integral power of two, while skipping reads of additional storage locations. For example, if a FIFO in such an embodiment has 10 storage locations, eight of the storage locations may be used to extend the resolution by three bits (since $8=2^3$), while a FIFO control circuit may cause reads of the two additional storage locations to be skipped.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. A system comprising:
a first-in, first-out (FIFO) buffer; and
a digital-to-analog converter (DAC) coupled to receive digital values from the FIFO buffer and configured to convert the digital values to an analog signal;
wherein the FIFO buffer is configured to operate in a first mode in which writes to the FIFO buffer are inhibited and current digital values stored in the FIFO buffer are provided to the DAC in a repeating sequence.

2. The system as recited in claim 1, wherein the FIFO buffer is configured to operate in a second mode in which the FIFO buffer receives and store digital values from an external bus, and further configured to provide the one or more of the of digital values to the DAC in an order in which they were received via the bus.

3. The system as recited in claim 2, further comprising a buffer control circuit coupled to the FIFO buffer, wherein the buffer control circuit is configured to, during operations in the first mode, cause a read pointer to sequentially point to corresponding storage locations in the FIFO buffer for the current digital values, wherein the FIFO buffer is configured to provide one of the current digital values to the DAC responsive to the read pointer pointing to the corresponding storage location.

4. The system as recited in claim 3, wherein the buffer control circuit is configured to, during operation in the first mode:
inhibit assertion of an indication that the FIFO buffer is empty after the read pointer has pointed to all of the storage locations; and
cause the read pointer to repeat sequentially pointing to the current digital values to the DAC and providing the current digital values to the DAC.

5. The system as recited in claim 4, wherein the buffer control circuit is configured to, during operation in the second mode:
sequentially read digital values from the storage locations of the FIFO buffer in accordance with a read pointer;
sequentially provide digital values read from the storage locations of the FIFO buffer to the DAC;
sequentially write digital values received from an external bus to the storage locations of the FIFO buffer in accordance with a write pointer, wherein sequentially writing data includes overwriting previously read digital values.

6. The system as recited in claim 5, wherein the buffer control circuit is configured to, when operating in the second mode:
cause an assertion of a buffer underrun signal if the read pointer advances at a rate higher than additional digital values are written to the FIFO buffer; and
cause an assertion of the indication that the FIFO buffer is empty responsive to reading all of the storage locations of the FIFO buffer prior to any additional digital values being written to the FIFO buffer.

7. The system as recited in claim 6, wherein the FIFO buffer is configured to store N digital values of M bits each, and wherein the DAC is configured to convert the first plurality of digital values into an analog signal having a resolution of (M+x) bits during operation in the first mode, wherein N=2x and wherein x is a number of additional bits of resolution.

8. The system as recited in claim 7, wherein the current digital values includes at least one instance of a first digital value and at least one instance of a second digital value, and wherein an analog signal output from the DAC corresponds to an interpolation between the first and second digital values.

9. The system as recited in claim 1, wherein the DAC is configured to convert the repeating sequence of the current digital values into a first periodic analog signal during operations in the first mode.

10. A method comprising:
operating a first-in, first-out (FIFO) buffer in a first mode in which writes to the FIFO buffer are inhibited;
generating an analog signal while operating in the first mode, wherein generating the analog signal comprises the DAC converting, in a repeating sequence, current digital values stored in the FIFO into a portion of the periodic analog signal.

11. The method as recited in claim 10, wherein operating in the first mode further comprises:
sequentially pointing to the corresponding storage locations for the current digital values;
inhibiting assertion of an indication that the FIFO buffer is empty after a read pointer has pointed to all storage locations of the FIFO buffer; and
repeating said sequentially pointing to the corresponding storage locations for the current digital values.

12. The method as recited in claim 11, further comprising operating the FIFO in a second mode, wherein operating in the second mode comprises:
sequentially writing digital values received from an external bus to the storage locations of the FIFO buffer in accordance with a write pointer; and
sequentially reading digital values from the storage locations of the FIFO buffer in accordance with the read pointer.

13. The method as recited in claim 12, further comprising:
asserting a buffer underrun signal if the read pointer advances at a rate higher than additional digital values are written to the FIFO buffer; and asserting the indication that the FIFO buffer is empty responsive to reading each of the digital values received from the external bus prior to any additional digital values being written to the FIFO buffer.

14. The method as recited in claim 13, further comprising the FIFO buffer receiving N digital values of M bits each, and wherein the method further comprises the DAC converting the N digital values into an analog signal having a resolution of (M+x) bits during operation of the FIFO buffer in the first mode, wherein N=2x and wherein x is an additional number of bits of resolution.

15. The method as recited in claim 14, wherein the N digital values includes at least one instance of a first digital value and at least one instance of a second digital value, and wherein the analog signal corresponds to an interpolation between the first and second digital values.

16. An apparatus comprising:
first-in first-out (FIFO) buffer configured to operate in a first mode in which writes to the FIFO buffer are inhibited; and
a digital-to-analog converter (DAC), wherein the DAC is configured, during operation in the first mode, to convert a repeating sequence of digital values received from the FIFO buffer into an analog signal, wherein each of the digital values includes M bits, and wherein the analog signal has a resolution of (M+x) bits, wherein x is an additional number of bits of resolution.

17. The apparatus as recited in claim 16, wherein the FIFO buffer is configured to store N digital values, and wherein N=2x.

18. The apparatus as recited in claim 17, wherein the N digital values includes at least one instance of a first digital value and at least one instance of a second digital value, and wherein the DAC is configured to generate an analog signal having a value corresponding to an average of the N digital values.

19. The apparatus as recited in claim 16, wherein the FIFO buffer is configured to, when operating in the second mode, read each of the digital values once and subsequently overwrite each of the digital values.

20. The apparatus as recited in claim 19, wherein the FIFO buffer is coupled to receive digital values from an external bus during operation in the second mode.

* * * * *